(12) United States Patent
Fujimura et al.

(10) Patent No.: US 10,517,177 B2
(45) Date of Patent: Dec. 24, 2019

(54) ON-VEHICLE ELECTRONIC CIRCUIT MOUNTING BOARD

(71) Applicant: Koito Manufacturing Co., Ltd., Tokyo (JP)

(72) Inventors: Hiroki Fujimura, Shizuoka (JP); Takashi Terayama, Shizuoka (JP); Hiroki Ishibashi, Shizuoka (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/029,862

(22) Filed: Jul. 9, 2018

(65) Prior Publication Data

US 2019/0029115 A1 Jan. 24, 2019

(30) Foreign Application Priority Data

Jul. 19, 2017 (JP) ................................. 2017-139852

(51) Int. Cl.
*H05K 1/11* (2006.01)
*H05K 1/18* (2006.01)
*H05K 1/02* (2006.01)
*B60R 16/02* (2006.01)

(52) U.S. Cl.
CPC ............. *H05K 1/181* (2013.01); *B60R 16/02* (2013.01); *H05K 1/0271* (2013.01); *H05K 1/111* (2013.01); *H05K 2201/09418* (2013.01)

(58) Field of Classification Search
CPC ...... H05K 1/181; H05K 1/111; H05K 1/0271; H05K 2201/09418
See application file for complete search history.

(56) References Cited

U.S. PATENT DOCUMENTS

| 5,621,619 | A | * | 4/1997 | Seffemick | ............... | H01C 13/02 |
| | | | | | | 174/138 G |
| 5,838,070 | A | * | 11/1998 | Naruse | .................. | H05K 1/111 |
| | | | | | | 257/779 |
| 7,506,438 | B1 | * | 3/2009 | Fu | ....................... | H01L 21/4857 |
| | | | | | | 174/259 |
| 2002/0043396 | A1 | * | 4/2002 | Morimoto | ......... | H01L 23/49838 |
| | | | | | | 174/250 |

(Continued)

FOREIGN PATENT DOCUMENTS

WO 2012/101978 A1 8/2012

*Primary Examiner* — Steven T Sawyer
(74) *Attorney, Agent, or Firm* — Abelman, Frayne & Schwab

(57) ABSTRACT

An on-vehicle electronic circuit mounting board includes: a surface mount type package component including a plurality of electrode pads disposed along an outer periphery of a component bottom surface; and a printed wiring board having a plurality of lands disposed along the plurality of electrode pads on a top surface of the printed wiring board opposed to the component bottom surface, and in which each land is disposed to be opposed to the corresponding electrode pad and electrically connected to the electrode pad by soldered connection. An outer soldering slope and an inner soldering slope are formed between a land of the plurality of lands and an electrode pad corresponding to the land, and the land is shifted with respect to the corresponding electrode pad such that one of the outer soldering slope and the inner soldering slope faces the wiring board side and the other faces the component side.

13 Claims, 6 Drawing Sheets

(56) References Cited

U.S. PATENT DOCUMENTS

| | | | |
|---|---|---|---|
| 2007/0223206 A1* | 9/2007 | Ogawa | H05K 1/111 |
| | | | 361/760 |
| 2008/0225500 A1* | 9/2008 | Kuroda | H05K 1/111 |
| | | | 361/767 |
| 2014/0177179 A1* | 6/2014 | Iiyama | H05K 3/3442 |
| | | | 361/748 |
| 2015/0263250 A1* | 9/2015 | Oka | H01L 33/62 |
| | | | 257/91 |
| 2017/0094788 A1* | 3/2017 | Sugimoto | H05K 1/111 |
| 2017/0208689 A1* | 7/2017 | Fukuzumi | H05K 1/0269 |

* cited by examiner

ON-VEHICLE ELECTRONIC CIRCUIT MOUNTING BOARD

CROSS-REFERENCE TO RELATED APPLICATIONS

This application is based on and claims priority from Japanese Patent Application No. 2017-139852, filed on Jul. 19, 2017 with the Japan Patent Office, the disclosure of which is incorporated herein in its entirety by reference.

TECHNICAL FIELD

The present disclosure relates to an on-vehicle electronic circuit mounting board.

BACKGROUND

Electronic components incorporated in a portable terminal are disclosed in, for example, International Publication WO 2012/101978. The electronic components include a rectangular circuit board in plan view. Components such as, for example, a semiconductor element, are mounted on the front surface of the rectangular circuit board, and a plurality of mounting electrodes is provided on the back surface of the rectangular circuit board. Mounting electrodes near the four corners of the circuit board are arranged at positions shifted from diagonal lines of the back surface of the circuit board in order to prevent breakage of the circuit board due to external impact, for example, when the portable terminal falls down.

SUMMARY

The inventors of the present disclosure have made extensive and intensive studies on an on-vehicle electronic circuit mounting board, and as a result have recognized the following problems. The board and the electronic components such as an IC mounted on the board are made of different materials. That is, the board and the electronic components have different thermal expansion coefficients. The board and the electronic components are connected by solder. Due to the heat generation of the electronic components or the change of the ambient temperature, difference in the magnitude of thermal deformation occurs between the board and the electronic components. Therefore, a relatively large thermal stress may act on the bonding interface between the board and the solder or the bonding interface between the electronic components and the solder. When the stress concentration repeatedly acts on the boding interfaces, cracks may be generated in the bonding interfaces. Growth of the cracks may hinder good electrical connection between the board and the electronic components and may finally cause an electrical open state. Even though the board and the electronic components are made of the same material, that is, there is no noticeable difference in the thermal expansion coefficients between the board and the electronic components, similar problems may occur in the soldered connection portion depending on a thermal environment such as local heat generation or uneven temperature distribution.

The present disclosure has been made in view of these circumstances, and an object of the present disclosure is to mitigate the influence of thermal stress acting on a soldered connection portion of an on-vehicle electronic circuit mounting board.

In order to solve the above mentioned problems, an on-vehicle electronic circuit mounting board according to one aspect of the present disclosure includes a surface mount type package component including a plurality of electrode pads arranged along an outer periphery of a component bottom surface thereof; and a printed wiring board having a plurality of lands arranged along the plurality of electrode pads on a top surface thereof facing the component bottom surface, each land being disposed to face a corresponding electrode pad and electrically connected to the corresponding electrode pad by soldered connection, wherein, an outer soldering slope and an inner soldering slope are formed between one land among the plurality of lands and an electrode pad corresponding to the one land, and the one land is shifted with respect to the corresponding electrode pad such that one of the outer soldering slope and the inner soldering slope faces a wiring board side and a remaining one faces a component side. An outer soldering slope and an inner soldering slope are formed between one land among the plurality of lands and an electrode pad corresponding to the one land, and the one land is shifted with respect to the corresponding electrode pad such that one of the outer soldering slope and the inner soldering slope faces a wiring board side and a remaining one faces a component side.

According to this aspect, it is possible to mitigate the influence of thermal stress acting on the soldered portion of the on-vehicle electronic mounting board.

One land may be shifted to the outside of the component with respect to the corresponding electrode pad and the one land may have a dimension larger than a dimension of the corresponding electrode pad in the shifted direction between the land and the electrode pad.

The bottom surface of the component may have a rectangular outer shape. The one land and the corresponding electrode pad may be located at an end of one side of the rectangular outline.

The component bottom surface may have a rectangular outer shape. The plurality of lands and the plurality of electrode pads may be provided on each of two opposite sides of the rectangular outer shape or on each of four sides of the rectangular outer shape. With respect to each of the two opposite sides or the four sides, an outer soldering slope and an inner soldering slope may be formed between the one land among the plurality of lands and the electrode pad corresponding to the one land, and the one land may be shifted with respect to the corresponding pad such that one of the outer soldering slope and the inner soldering slope faces the wiring board side and a remaining one faces the component side.

According to the present disclosure, it is possible to mitigate the influence of thermal stress acting on the soldered portion of the on-vehicle electronic mounting board.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Hereinafter, the present disclosure will be described with reference to the drawings based on exemplary embodiments. Further, the exemplary embodiments are not intended to limit the present disclosure thereto, but are merely exemplary. All features described in the exemplary embodiments or combinations thereof may not be essential for the present disclosure. Identical or corresponding components, members, and processes in each of the drawings will be denoted by the same symbols, and overlapping descriptions thereof will be appropriately omitted. In addition, a scale or a shape of each component illustrated in each of the drawings is conveniently set in order to facilitate descriptions thereof and should not be construed as being limited unless specified. Further, the terms such as, for example, "first" and "second" used herein or the claims are not intended to refer to any order or importance but are intended to discriminate a component from another component.

Figure 1:
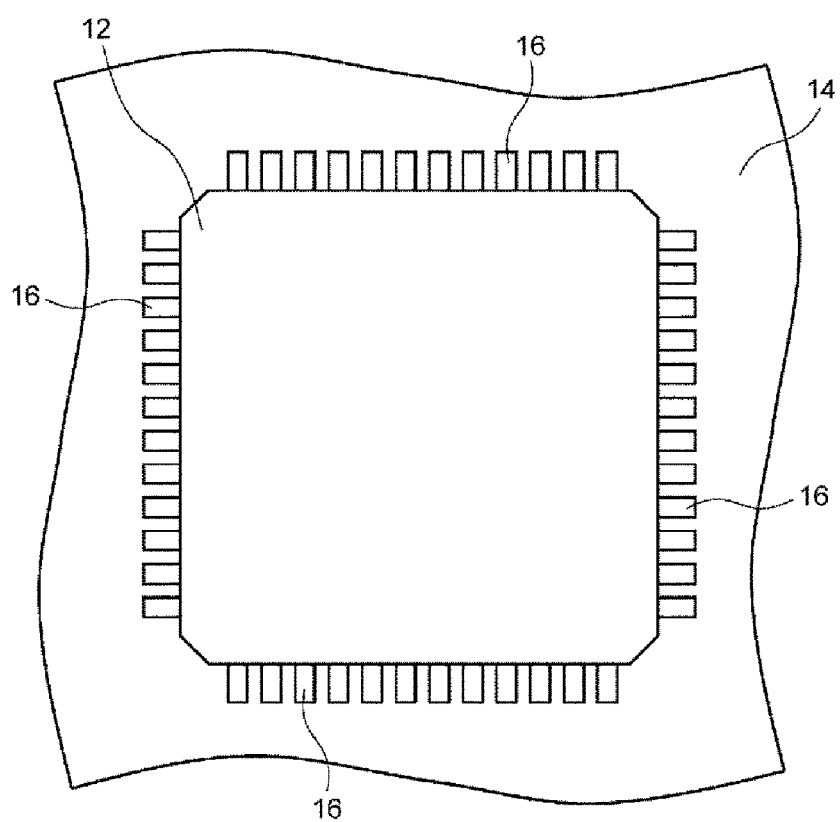
FIG. 1 is a schematic top view illustrating an on-vehicle electronic circuit mounting board according to an exemplary embodiment.

FIG. 1 is a schematic top view illustrating an on-vehicle electronic circuit mounting board according to an exemplary embodiment. The on-vehicle electronic circuit mounting board (hereinafter, also simply referred to as an "electronic circuit board") 10 may be, for example, a control device for a vehicle lamp used for a vehicle such as an automobile or a part thereof, or may be any other electronic circuit device.

The electronic circuit board 10 includes a semiconductor integrated circuit component (hereinafter, also simply referred to as an "IC") 12 which is an example of a surface mount type package component and a printed wiring board 14 on which the IC 12 is mounted. The IC 12 is electrically connected to the printed wiring board 14 by a large number of soldered connection portions 16. As will be described later, a large number of electrode pads are disposed along the outer periphery of the bottom surface of the IC 12 and a large number of lands are disposed on the top surface of the printed wiring board 14 along the row of the electrode pads. The corresponding electrode pads and lands are connected by the individual soldered connection portions 16. The IC 12 has a rectangular outer shape in a plan view, and a plurality of soldered connection portions 16 is disposed along each of four sides. In the electronic circuit board 10, various electronic components may be mounted around the IC 12 in addition to the IC 12, but the description thereof is omitted here for simplicity.

Figure 2:
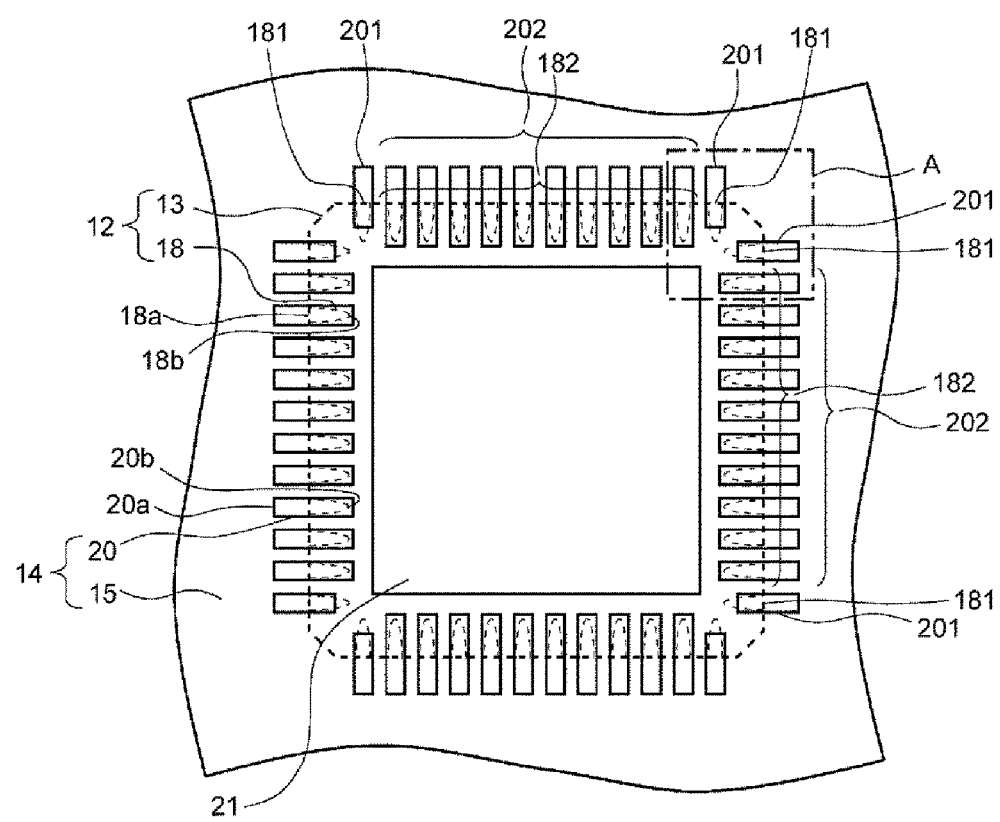
FIG. 2 is a schematic top view illustrating a printed wiring board illustrated in FIG. 1.

FIG. 2 is a schematic top view illustrating the printed wiring board 14 illustrated in FIG. 1. In FIG. 2, for understanding, the bottom surface 13 of the IC 12 (hereinafter, also referred to as a "component bottom surface") facing the top surface 15 of the printed wiring board 14 (hereinafter, also referred to as a "wiring board top surface") and a large number of electrode pads 18 disposed along the outer periphery of the component bottom surface 13 are indicated by broken lines.

The component bottom surface 13 has a rectangular outer shape, and a plurality of the electrode pads 18 is disposed along each of the four sides thereof. The electrode pads 18 are metallic terminal portions for electrical connection with the outside and are exposed from a sealing resin portion of the IC 12 to the component bottom surface 13. The electrode pads 18 may be exposed on both the component bottom surface 13 and a component side surface. Further, the IC 12 has no lead.

The electrode pads 18 arranged along one side of the component bottom surface 13 have a shape elongated in a direction perpendicular to the one side of the component bottom surface toward the inside of the component. An outer edge 18a of each electrode pad 18 forms a part of the side of the component bottom surface 13. Although an inner edge 18b of each electrode pad 18 has a semicircular shape in the illustrated example, the shape of the inner edge is not limited thereto. The inner edge of each electrode pad may have any shape other than a rectangular shape. Here, all the electrode pads 18 have the same shape, but it is not essential.

The printed wiring board 14 includes a conductor pattern including a large number of lands 20 formed on the wiring board top surface 15 and an insulating resin layer. The lands 20 are disposed in a rectangular shape along each of the four sides of the component bottom surface 13. Each land 20 is disposed to face the corresponding electrode pad 18 and is electrically connected to the electrode pad by soldered connection. The conductor pattern of the printed wiring board 14 includes a rectangular central conductor region 21 surrounded by the large number of lands 20. The insulating resin layer of the printed wiring board 14 is made of a material different from the sealing resin portion of the IC 12, so that the IC 12 and the printed wiring board 14 have thermal expansion coefficients different from each other.

Each land 20 is disposed direct below the corresponding electrode pad 18, and is elongated along the electrode pad 18. The outer edge 20a of each land 20 is located outside the side of the component bottom surface 13 and the inner edge 20b of the land 20 is located inside the side of the component bottom surface 13. Each land 20 has a rectangular shape, but the shape is not limited thereto.

Hereinafter, for the convenience of description, an electrode pad 18 located at an end of one side of the rectangular outer shape of the component bottom surface 13 will be referred to as a "terminal pad 181," and an electrode pad 18 other than the terminal pad 181 may be referred to as a "central pad 182." That is, terminal pads 181 are located near apexes of the rectangular outer shape of the component bottom surface 13. The central pads 182 are interposed between the terminal pads 181 located at the both ends of one side of the component bottom surface 13. Likewise, for the convenience of description, the lands 20 facing the terminal pads 181 will be referred to as "terminal lands 201," and the lands 20 facing the central pads 182 may be referred to as a "central lands 202."

Figure 3:
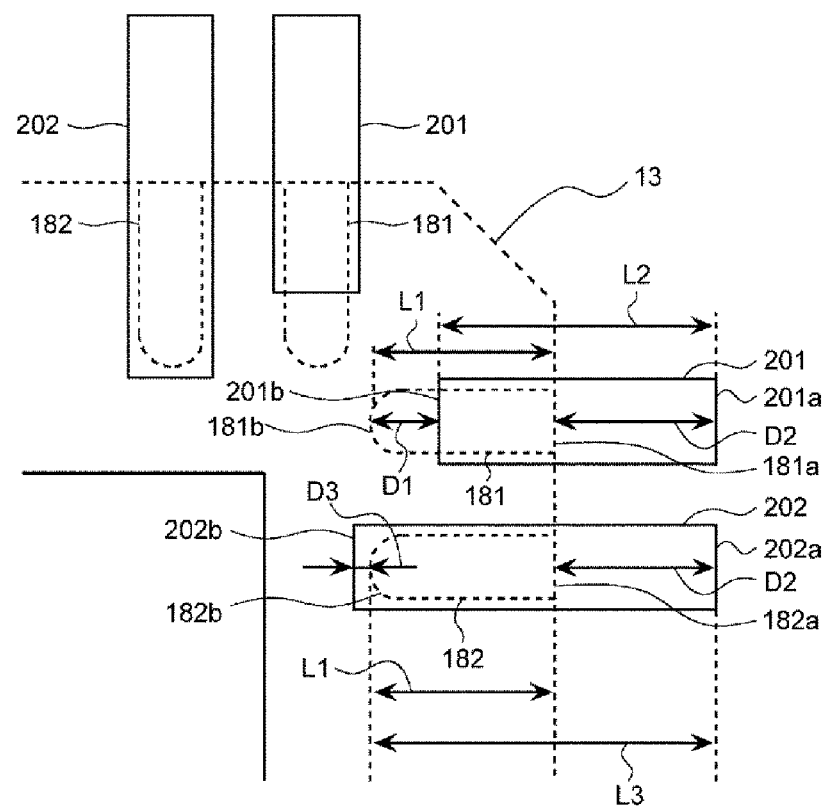
FIG. 3 is a schematic view illustrating a region A in FIG. 2 in an enlarged scale.

FIG. 3 is an enlarged schematic view illustrating a region A in FIG. 2. The positional relationship between terminal pads 181 and terminal lands 201 and the positional relationship between central pads 182 and central lands 202 are illustrated in FIG. 3.

In an exemplary embodiment illustrated in FIG. 3, the terminal lands 201 are shifted to the outside of the component with respect to the terminal pad 181. That is, the outer edges 201a of the terminal lands 201 are located outside the outer edges 181a of the terminal pads 181 and the inner edges 201b of the terminal lands 201 are located outside the inner edges 181b of the terminal pads 181.

The length L1 of the terminal lands 201 is longer than the length L2 of the terminal pads 181. Here, the lengths of each electrode pad 18 and each land 20 refer to the dimension of the electrode pad 18 and the land 20 in the shifted direction between the land 20 and the electrode pad 18, i.e. with respect to the direction perpendicular to the corresponding side of the component bottom surface 13. A distance D2 between the outer edge 201a of the terminal land 201 and the outer edge 181a of the terminal pad 181 is longer than a distance D1 between the inner edge 201b of the terminal land 201 and the inner edge 181b of the terminal pad 181.

The outer edges 202a of the central lands 202 are located outside the outer edges 182a of the central pads 182 and the inner edges 202b of the central lands 202 are located inside the inner edges 182b of the central pads 182. The length L3 of each central land 202 is longer than the length L1 of each central pad 182. A distance D2 between the outer edge 202a of the central land 202 and the outer edge 182a of the central pad 182 is longer than a distance D3 between the inner edge 202b of the central land 202 and the inner edge 182b of the central pad 182.

Further, in the exemplary embodiment illustrated in FIG. 3, the width of each terminal land 201 is larger than the width of each terminal pad 181. Likewise, the width of each central land 202 is larger than the width of each central pad 182. The widths of the electrode pad 18 and the land 20 refer to the dimensions of the electrode pad 18 and the land 20 with respect to the direction along the corresponding side of the component bottom surface 13. However, the width of the lands 20 may be the same as the width of the electrode pads 18, or may be smaller than the width of the electrode pads 18.

The above-described relative dimensional relationships between the lands 20 and the electrode pads 18 are merely an example, and the present disclosure is not limited thereto. The lands 20 and the electrode pads 18 may have other dimensional relationships.

Figure 4A:
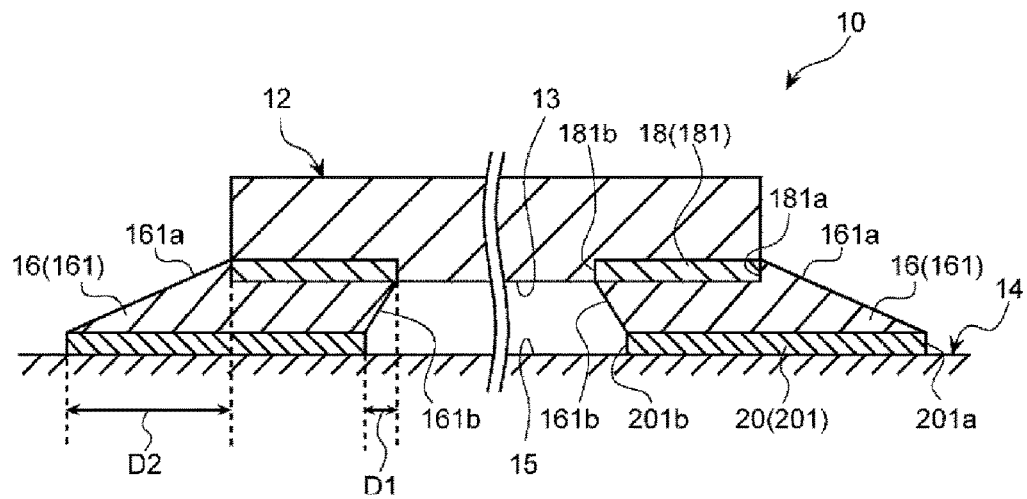
FIGS. 4A and 4B are schematic side cross-sectional views illustrating a soldered connection portion and a surrounding structure thereof illustrated in FIG. 1.
Figure 4B:
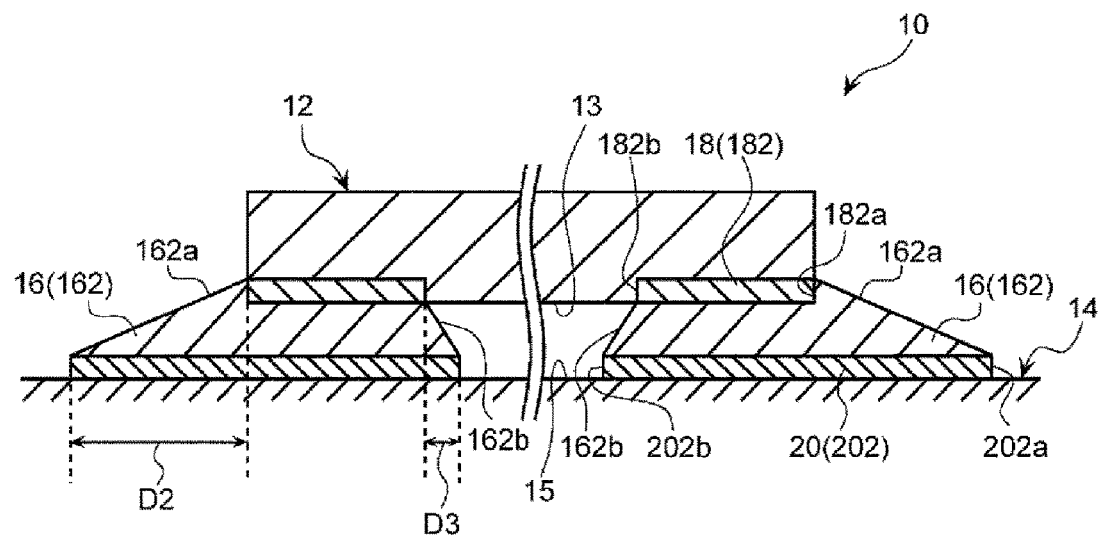

FIGS. 4A and 4B are schematic side cross-sectional views illustrating soldered connection portions 16 and surrounding structures thereof illustrated in FIG. 1. In FIGS. 4A and 4B, two different soldered connection portions 16 formed on two opposite sides of the IC 12 are exemplified. In FIG. 4A, first soldered connection portions 161 connecting the terminal pads 181 to the terminal lands 201 are illustrated. In FIG. 4B, second soldered connection portions 162 connecting the central pads 182 to the central lands 202 are illustrated. The shapes of slopes on the soldered connection portions 16 will be described with reference to FIGS. 4A and 4B.

A first outer soldering slope 161a and a first inner soldering slope 161b of the first soldered connection portion 161 are formed between a terminal pad 181 and a terminal land 201. The first outer soldering slope 161a connects the outer edge 201a of the terminal land 201 to the outer edge 181a of the terminal pad 181. The first inner soldering slope 161b connects the inner edge 201b of the terminal land 201 to the inner edge 181b of the terminal pad 181.

The terminal land 201 is shifted with respect to the terminal pad 181 such that the first inner soldering slope 161b faces the printed wiring board 14 side and the first outer soldering slope 161a faces the IC 12 side. As described above, the terminal land 201 is shifted to the outside of the component with respect to the terminal pad 181.

Since the distance between the component bottom surface 13 and the wiring board top surface 15 is constant and the distance D1 is longer than the distance D2, the inclination angle of the first outer soldering slope 161a is smaller than that of the first inner soldering slope 161b. When the distance D1 is equal to the distance D2, the first outer soldering slope 161a and the first inner soldering slope 161b are substantially parallel to each other, and the first soldered connection portion 161 has a parallelogram shape in a side view.

A second outer soldering slope 162a and a second inner soldering slope 162b of the second soldered connection portion 162 are formed between a central pad 182 and a central land 202. The second outer soldering slope 162a connects the outer edge 202a of the central land 202 to the outer edge 182a of the central pad 182. The second inner soldering slope 162b connects the inner edge 202b of the central land 202 to the inner edge 182b of the central pad 182. Both the second outer soldering slope 162a and the second inner soldering slope 162b face the IC 12 side. Since the distance D3 is longer than the distance D2, the inclination angle of the second outer soldering slope 162a is smaller than that of the second inner soldering slope 162b.

Figure 5:
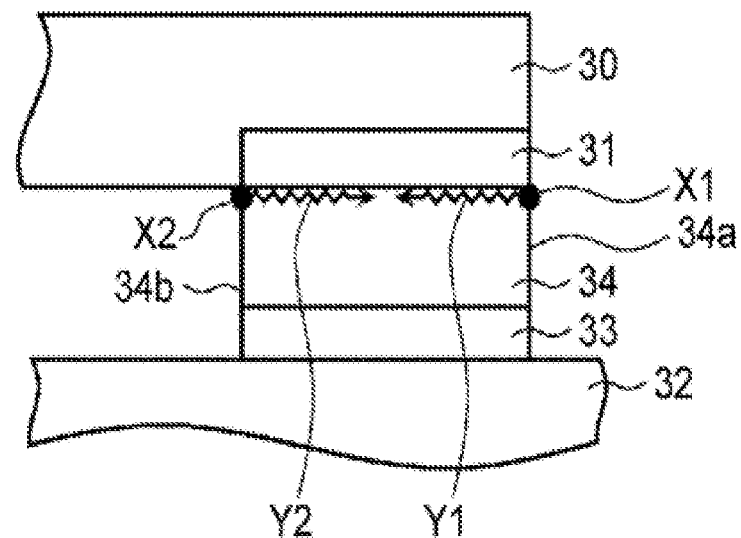
FIG. 5 is a schematic view for explaining a crack that may be generated in a typical solder bonding shape.

FIG. 5 is a schematic view for explaining cracks that may be generated in one typical solder bonding shape. In the typical configuration illustrated in FIG. 5, an electrode 31 of an electronic component 30 and a land 33 of a board 32 have the same shape and position, so that a solder bonding shape 34 has no slope. Both the outer edge 34a and inner edge 34b of the solder bonding shape 34 are perpendicular to the board 32. In this configuration, thermal stress is concentrated on the bonding interface of the electrode 31 and the solder bonding shape 34 (black circles X1 and X2). As a result, cracks progress (indicated by wavy arrows Y1 and Y2) from the outer edge 34a and inner edge 34b of the solder bonding shape 34 along the same bonding interface. The cracks are connected to each other and are likely to reach the electrically open state.

Figure 6:
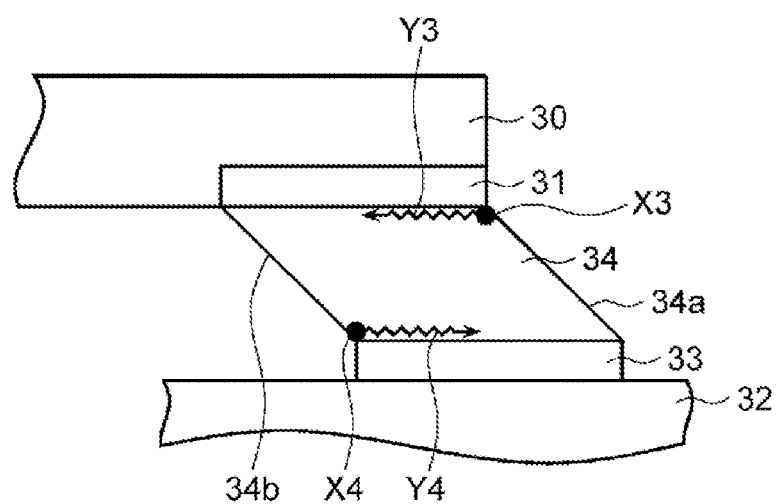
FIG. 6 is a schematic view for explaining a crack that may be generated in a typical solder bonding shape according to an exemplary embodiment.

FIG. 6 is a schematic view for explaining cracks that may be generated in a typical solder bonding shape according to an exemplary embodiment. With respect to an electrode 33 of an electronic component 30, a land 33 of a board is shifted to the outside of the electronic component. Therefore, both the outer edge 34a and the inner edge 34b of a solder bonding shape 34 are inclined with respect to a board 32 and the solder bonding shape 34 has a parallelogram shape or a similar shape. In this case, the thermal stress may be dispersed in the bonding interface of the solder bonding shape 34 and in the bonding interface of the land 33 and the solder bonding shape 34 (black circles X3 and X4). Even if the cracks progress in each of these two bonding interfaces (indicated by wavy arrows Y3 and Y4), these cracks are hardly directly connected to each other because the cracks are located at different interfaces. Therefore, according to the exemplary embodiment, an electrically open state hardly occurs compared with the configuration illustrated in FIG. 5. As can be appreciated, the electronic component 30 and the board 30 may be, for example, the IC 12 and the printed wiring board 14, respectively.

As described above, according to the electronic circuit board 10 of the exemplary embodiment, the terminal lands 201 are shifted with respect to the terminal pads 181 such that the first inner soldering slopes 161b face the printed wiring board 14 side and the first outer soldering slopes 161a face the IC 12 side. Due to the shape of the soldered connection portions 16, the influence of the thermal stress acting on the soldered connection portions 16 may be mitigated. As a result, the rupture of the soldered connection portions 16 may be prevented or delayed. Therefore, it is possible to suppress electrical opening which may occur due to progress of cracks.

When the electronic circuit board 10 is designed for a vehicle, the usage environment in a considerably wide temperature range is assumed. Since the influence of thermal stress is mitigated, the electronic circuit board 10 may easily be adapted to such a thermally harsh usage environment. Therefore, the electronic circuit board 10 is advantageous as an on-vehicle electronic circuit mounting board.

When the IC 12 has a rectangular outer shape, a larger thermal stress may occur in the vicinity of the apex of the rectangular. Disposing the terminal land 201 and the terminal pad 181 located at the ends of one side of the rectangular outer shape to be shifted from each other is effective for mitigating such influence of thermal stress.

Further, the lands 20 are shifted to the outside of the component with respect to the electrode pads 18 and the lands 20 are longer than the electrode pads 18 in the shifted direction. In this way, it is easy to observe the soldered connection portions 16 from outside or above the IC 12. In addition to mitigation of the thermal stress, there is an advantage in that a defect of the soldered connection portions 16 is easily detected.

In the above described exemplary embodiment, the terminal lands 201 are shifted to the outside of the component with respect to the electrode pads 181 and the terminal lands 201 are longer than the terminal pad 181 in the shifted direction. However, the exemplary embodiment of the present disclosure is not limited thereto. Instead of a set of terminal lands 201 and the corresponding terminal pads 181, or together with a set of terminal lands 201 and the corresponding terminal pads 181, the exemplary embodiment of the present disclosure may be applied to a set of central lands 202 and the corresponding central pads 182. The exemplary embodiment of the present disclosure may also be applied to an arbitrary land 20 and a corresponding electrode pad 18.

The above described exemplary embodiment, the terminal lands 201 are shifted to the outside of the component with respect to the electrode pads 181. However, the exemplary embodiment of the present disclosure is not limited thereto. The terminal lands 201 may be shifted to the inside of the component with respect to the terminal pad 181 such that the first outer soldering slopes 161a face the printed wiring board 14 side and the first inner soldering slopes 161b face the IC 12 side. Likewise, the central lands 202 may be shifted to the inside of the component with respect to the central pads 182.

In the exemplary embodiment described above, a four-way connection surface mount type package component has been described by way of an example, but the exemplary embodiment of the present disclosure may be applied to a two-way connection surface mount type package component. The plurality of lands 20 and the plurality of electrode pads 18 may be provided on each of two opposite sides of the rectangular outer shape of the component bottom surface 13. For each of the two sides, the first outer soldering slopes 161a and the second inner soldering slopes 162b of the first soldered connection portions 161 may be formed between the lands of the plurality of lands 20 (e.g., the terminal lands 201) and the electrode pads corresponding to the lands (e.g., the terminal pads 181). The lands may be shifted with respect to the corresponding electrode pads such that one side of the first outer soldering slopes 161a and the second inner soldering slopes 162b faces the printed wiring board 14 and the other side faces the IC 12 side.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. An on-vehicle electronic circuit mounting board comprising:
   a surface mount type package component including a plurality of electrode pads arranged along an outer periphery of a bottom surface thereof; and a printed wiring board having a plurality of lands arranged along the plurality of electrode pads on a top surface thereof facing the bottom surface of the surface mount type package component, each land being disposed to face a corresponding electrode pad and electrically connected to the corresponding electrode pad by soldered connection, wherein an outer soldering slope and an inner soldering slope are formed between one land among the plurality of lands and an electrode pad corresponding to the one land, the one land is shifted with respect to the corresponding electrode pad such that one of the outer soldering slope and the inner soldering slope faces a side of the printed wiring board and a remaining one faces a side of the surface mount type package component, the outer soldering slope connects an outer edge of the one land to an outer edge of the corresponding electrode pad, and the inner soldering slope connects an inner edge of the one land to an inner edge of the corresponding electrode pad, and an inclination angle of the outer soldering slope with respect to a top surface of the one land is smaller than that of the inner soldering slope with respect to the top surface of the one land, wherein the one land is shifted to an outside of the surface mount type package component with respect to the corresponding electrode pad, and the one land has a dimension larger than a dimension of the corresponding electrode pad with respect to a direction in which the one land is shifted with respect to the corresponding electrode pad.

2. The on-vehicle electronic circuit mounting board of claim 1, wherein the bottom surface of the surface mount type package component has a rectangular outer shape, and the one land and the corresponding electrode pad are located at an end of one side of the rectangular outer shape.

3. The on-vehicle electronic circuit mounting board of claim 1, wherein the bottom surface of the surface mount type package component has a rectangular outer shape,
   the plurality of lands and the plurality of electrode pads are provided on each of two opposite sides of the rectangular outer shape or on each of four sides of the rectangular outer shape, and
   with respect to each of the two opposite sides or the four sides, the outer soldering slope and the inner soldering slope are formed between the one land among the plurality of lands and the electrode pad corresponding to the one land, and the one land is shifted with respect to the corresponding pad such that one of the outer soldering slope and the inner soldering slope faces the side of the printed wiring board and a remaining one faces the side of the surface mount type package component.

4. The on-vehicle electronic circuit mounting board of claim 2, wherein the bottom surface of the surface mount type package component has a rectangular outer shape,
   the plurality of lands and the plurality of electrode pads are provided on each of two opposite sides of the rectangular outer shape or on each of four sides of the rectangular outer shape, and with respect to each of the two opposite sides or the four sides, the outer soldering slope and the inner soldering slope are formed between the one land among the plurality of lands and the electrode pad corresponding to the one land, and the one land is shifted with respect to the corresponding pad such that one of the outer soldering slope and the inner soldering slope faces the side of the printed wiring board and a remaining one faces the side of the surface mount type package component.

5. The on-vehicle electronic circuit mounting board of claim 1, wherein the soldered connection has a parallelogram shape when viewed in a side cross section.

6. An on-vehicle electronic circuit mounting board comprising:
a surface mount type package component including a plurality of terminal pads and a plurality of central pads arranged along an outer periphery of a bottom surface thereof having a rectangular outer shape; and
a printed wiring board having a plurality of terminal lands and a plurality of central lands arranged along the plurality of terminal pads and the plurality of central pads on a top surface thereof facing the component bottom surface, each of the plurality of terminal lands being disposed to face a corresponding terminal pad and each of the plurality of central lands being disposed to face a corresponding central pad, and each of the plurality of terminal lands and the plurality of central lands being electrically connected to the corresponding terminal pad and the corresponding central pad by soldered connection,
wherein a first outer soldering slope and a first inner soldering slope are formed between one terminal land among the plurality of terminal lands and a terminal pad corresponding to the one terminal land, the one terminal land and the terminal pad corresponding to the one terminal land are located at an end of one side of the rectangular outer shape,
a second outer soldering slope and a second inner soldering slope are formed between one central land among the plurality of central lands and a central pad corresponding to the one central land, and,
the one terminal land is shifted with respect to the corresponding terminal pad such that the first inner soldering slope faces a side of the wiring board and the first outer soldering slope faces a side of the surface mount type package component,
both the second outer soldering slope and the second inner soldering slope face the side of the surface mount type package component.

7. The on-vehicle electronic circuit mounting board of claim 6, wherein the one terminal land is shifted to an outside of the surface mount type package component with respect to the corresponding terminal pad, and the one terminal land has a dimension larger than a dimension of the corresponding terminal pad with respect to a direction in which the one terminal land is shifted with respect to the corresponding terminal pad.

8. The on-vehicle electronic circuit mounting board of claim 6, wherein the plurality of terminal lands, the plurality of central lands, the plurality of terminal pads and the plurality of central pads are provided on each of two opposite sides of the rectangular outer shape or on each of four sides of the rectangular outer shape, and
with respect to each of the two opposite sides or the four sides, the first outer soldering slope and the first inner soldering slope are formed between the one terminal land among the plurality of terminal lands and the terminal pad corresponding to the one terminal land, the one terminal land is shifted with respect to the corresponding terminal pad such that the first inner soldering slope faces the side of the wiring board and the first outer soldering slope faces the side of the surface mount type package component, the second outer soldering slope and the second inner soldering slope are formed between the one central land among the plurality of central lands and the central pad corresponding to the one central land, and both the second outer soldering slope and the second inner soldering slope face the side of the surface mount type package component.

9. The on-vehicle electronic circuit mounting board of claim 7, wherein the plurality of terminal lands, the plurality of central lands, the plurality of terminal pads and the plurality of central pads are provided on each of two opposite sides of the rectangular outer shape or on each of four sides of the rectangular outer shape, and
with respect to each of the two opposite sides or the four sides, the first outer soldering slope and the first inner soldering slope are formed between the one terminal land among the plurality of terminal lands and the terminal pad corresponding to the one terminal land, the one terminal land is shifted with respect to the corresponding terminal pad such that the first inner soldering slope faces the side of the wiring board and the first outer soldering slope faces the side of the surface mount type package component, the second outer soldering slope and the second inner soldering slope are formed between the one central land among the plurality of central lands and the central pad corresponding to the one central land, and both the second outer soldering slope and the second inner soldering slope face the side of the surface mount type package component.

10. The on-vehicle electronic circuit mounting board of claim 8, wherein the plurality of terminal lands, the plurality of central lands, the plurality of terminal pads and the plurality of central pads are provided on each of two opposite sides of the rectangular outer shape or on each of four sides of the rectangular outer shape, and
with respect to each of the two opposite sides or the four sides, the first outer soldering slope and the first inner soldering slope are formed between the one terminal land among the plurality of terminal lands and the terminal pad corresponding to the one terminal land, the one terminal land is shifted with respect to the corresponding terminal pad such that the first inner soldering slope faces the side of the wiring board and the first outer soldering slope faces the side of the surface mount type package component, the second outer soldering slope and the second inner soldering slope are formed between the one central land among the plurality of central lands and the central pad corresponding to the one central land, and both the second outer soldering slope and the second inner soldering slope face the side of the surface mount type package component.

11. The on-vehicle electronic circuit mounting board of claim 9, wherein the plurality of terminal lands, the plurality of central lands, the plurality of terminal pads and the plurality of central pads are provided on each of two opposite sides of the rectangular outer shape or on each of four sides of the rectangular outer shape, and with respect to each of the two opposite sides or the four sides, the first outer soldering slope and the first inner soldering slope are formed between the one terminal land among the plurality of terminal lands and the terminal pad corresponding to the one terminal land, the one terminal land is shifted with respect to the corresponding terminal pad such that the first inner soldering slope faces the side of the wiring board and the first outer soldering slope faces the side of the surface mount type package component, the second outer soldering slope and the second inner soldering slope are formed between the one central land among the plurality of central lands and the central pad corresponding to the one central land, and both the second outer soldering slope and the second inner soldering slope face the side of the surface mount type package component.

12. The on-vehicle electronic circuit mounting board of claim 7, wherein the soldered connection has a parallelogram shape when viewed in a side cross section.

13. The on-vehicle electronic circuit mounting board of claim 7, wherein an inclination angle of the first outer soldering slope with respect to a top surface of the one terminal land is smaller than that of the first inner soldering slope with respect to the top surface of the one terminal land, and
an inclination angle of the second outer soldering slope with respect to a top surface of the one central land is smaller than that of the second inner soldering slope with respect to the top surface of the one central land.

* * * * *